(12) United States Patent
Verreck et al.

(10) Patent No.: US 12,406,732 B2
(45) Date of Patent: Sep. 2, 2025

(54) METHOD OF PROGRAMMING FLASH MEMORY

(71) Applicant: IMEC VZW, Leuven (BE)

(72) Inventors: Devin Verreck, Pellenberg (BE); Maarten Rosmeulen, Ghent (BE)

(73) Assignee: IMEC vzw, Leuven (BE)

( * ) Notice: Subject to any disclaimer, the term of this patent is extended or adjusted under 35 U.S.C. 154(b) by 78 days.

(21) Appl. No.: 18/477,456

(22) Filed: Sep. 28, 2023

(65) Prior Publication Data

US 2024/0112737 A1 Apr. 4, 2024

(30) Foreign Application Priority Data

Sep. 30, 2022 (EP) ..................................... 22198979

(51) Int. Cl.
G11C 16/04 (2006.01)
G11C 16/10 (2006.01)
G11C 16/16 (2006.01)

(52) U.S. Cl.
CPC .......... *G11C 16/10* (2013.01); *G11C 16/0483* (2013.01); *G11C 16/16* (2013.01); *G11C 2216/02* (2013.01)

(58) Field of Classification Search
CPC .......................... G11C 16/0483; G11C 16/3454
USPC ........................................... 365/185.02, 185.2
See application file for complete search history.

(56) References Cited

U.S. PATENT DOCUMENTS

| 10,381,095 | B1* | 8/2019 | Date ...................... G11C 16/16 |
| 2021/0066344 | A1 | 3/2021 | Son et al. |
| 2021/0398593 | A1 | 12/2021 | Song et al. |

OTHER PUBLICATIONS

Extended European Search Report dated Feb. 20, 2023 in European Application No. 22198979.1, in 8 pages.
Chen et al., "Effects of independent double-gated configuration on polycrystalline-Si nonvolatile memory devices", Applied Physics Letters 95, 133502 (2009); doi: 10.1063/1.3238362.
Hsiao et al., "Ultra-High Bit Density 3D NAND Flash-Featuring-Assisted Gate Operation", IEEE Electron Device Letters, vol. 36, No. 10, Oct. 2015.
Walker, "Sub-50-nm Dual-Gate Thin-Film Transistors for Monolithic 3-D Flash", IEEE Transactions on Electron Devices, vol. 56, No. 11, Nov. 2009.

* cited by examiner

*Primary Examiner* — Jason Lappas
(74) *Attorney, Agent, or Firm* — Knobbe, Martens, Olson & Bear, LLP (57) ABSTRACT

This disclosed technology relates to a programmable NAND flash memory and a method for operating the NAND flash memory. The method comprises applying a first voltage to the first gate and a pass voltage to one or more word lines to allow charge to inject into the channel layer and form charge packets. Each charge packet can be arranged next to one of the second gates. The method further comprises applying a programming voltage to the word lines to move the charge packets from the channel layer into the memory cells associated with the second gates next to which they are arranged.

17 Claims, 5 Drawing Sheets

METHOD OF PROGRAMMING FLASH MEMORY

CROSS-REFERENCE TO RELATED APPLICATIONS

This application claims foreign priority to European Application No. 22198979.1, filed Sep. 30, 2022, which is incorporated by reference herein in its entirety.

BACKGROUND

Field

The disclosed technology relates to a NAND flash memory. More specifically, the disclosed technology relates to a method for programming a NAND flash memory.

Description of the Related Technology

NAND flash memory is a type of memory that can store information in a non-volatile storage in the form of charge carriers (e.g., electrons and/or holes) in a charge trap layer or in a floating gate, which is part of a flash cell transistor and forms a memory cell of the NAND flash memory. The concentration of the stored charge carriers can correspond to bits of information and can be read based on the resulting threshold voltage shift in the memory cell. Quantum tunneling is utilized to change the charge carrier concentration, thereby writing or erasing information into or from a memory cell.

To increase densities of bit cells, the dimensions of the memory cells of the NAND flash memory have been scaled down over previous technology generations. Subsequently, the dominant production technology shifted from planar NAND flash memory to vertical NAND flash memory, such as three-dimensional (3D) flash memory. In some 3D flash memory technologies, a string (e.g., memory cells) of the NAND flash memory can include a cylindrical memory hole along which the memory cells are arranged. The string can be fabricated by first depositing a stack of alternating layers, followed by etching the memory hole and filling the hole with the memory and the channel layers. The 3D structures allow increasing the bit density by adding more memory cells to the strings rather than scaling the memory cell dimensions.

With the increasing number of memory cells on a string, however, the etching of the memory hole becomes more challenging since the aspect ratio of the 3D structure increases. This has resulted in a renewed push to scale down the vertical memory cell pitch, wherein the memory cell pitch includes the memory cell's gate length and the inter-gate spacing.

However, scaling down the memory cell pitch results in a larger risk of breakdown between different word lines connected to the gates of the memory cells. Two main factors may contribute to this. First, the voltages required during the programming operation increase with smaller memory cell dimensions due to the decreased capacitive coupling of the gate with the channel. This results in a larger voltage difference between the word line of a memory cell that is being programmed and the neighboring memory cell that is under a pass bias increases. Increasing the pass bias may not necessarily be a practical solution, as it can lead to unacceptable program disturbance. Second, the reduced inter-gate spacing results in higher electric fields for a given voltage difference between the word lines, further increasing the risk of dielectric breakdown.

SUMMARY OF CERTAIN INVENTIVE ASPECTS

The disclosed technology aims to provide a solution to the problems described above. These and other aims are achieved by various aspects in accordance with the embodiments of the disclosed technology. The objective of the disclosed technology is to provide a novel NAND flash memory programming method that overcomes the above described challenges. In addition, the objective is to obtain small differential voltage(s) between adjacent word lines. Another objective is decreasing the dielectric breakdown risk between different word lines. These and other alternative objectives can be achieved and understood from the following, such as by the solution provided in the independent claim(s). In addition, the additional advantageous implementations are provided in the dependent claims. The solutions can be implemented in a method including moving charge in the form of one or more charge packets from a channel into charge storage layers of a NAND memory.

The first aspect of this disclosed technology provides a method for programming a NAND flash memory, wherein the NAND flash memory includes a semiconductor channel layer, a first gate arranged on a first side of the channel layer and extending along the channel layer, and a plurality of second gates arranged on a second side of the channel layer and one after the other along the channel layer, wherein each second gate is associated with one memory cell of the NAND flash memory and is connected to one of a plurality of word lines. The method of programming the NAND flash memory can include applying a first voltage to the first gate and a pass voltage to one or more of the word lines to allow charges to inject into the channel layer next to one or more of the second gates and form one or more charge packets from the charge in the channel layer, wherein each charge packet is arranged next to one of the one or more second gates; and applying a programming voltage to one or more of the word lines to move the one or more charge packets from the channel layer into the one or more memory cells associated with the one or more second gates next to which the charge packets are arranged.

The method of the first aspect may decrease the risk of dielectric breakdown between different word lines. This can be achieved by the method that only small differential voltages between adjacent word lines are necessary. This is due to the preparation of the charge packets in advance and then applying the (same) programming voltage to the one or more word lines. In addition, the first voltage on the first gate may improve control over the charge packet concentration.

The programming voltage may be applied as a programming voltage pulse to the one or more word lines. The method of the first aspect may enable individual programming of the memory cells in the NAND flash memory, thereby allowing for the setting of their individual threshold voltages.

Each memory cell may include a charge trap layer or floating gate to store the charge packet. The second gate associated with the memory cell can be used to control the memory cell. In some embodiments, a memory cell, second gate, and channel layer may form a flash cell transistor.

In an implementation of the method, the programming voltage on the one or more of the word lines can be applied at the same time and/or a voltage on one or more of the word lines can be increased by the same amount at the same time to the programming voltage.

This method can help to avoid differential voltages that may arise due to time differences in applying the programming voltage.

In some embodiments of forming a charge packet in the channel layer next to a particular second gate, the method can include applying a blocking voltage to one or more second gates other than the particular second gate to isolate the charge that is arranged next to the particular second gate as the charge packet.

The differential voltage between word lines can be limited to the difference between the blocking voltage and the pass voltage, which can be reasonably low to avoid word line dielectric breakdown.

In an implementation of the method, the NAND flash memory can further include a source contact and a drain contact, which are connectable to the channel layer and also disconnectable from the channel layer. The method can also include: connecting the source contact and/or the drain contact to the channel layer when the charge is injected into the channel layer; and disconnecting the source contact and the drain contact from the channel layer when the one or more charge packets are moved from the channel layer into the memory cells.

In an implementation of the method, the source contact and the drain contact are respectively connectable to the channel layer via two or more select transistors, which are controllable by two or more select gates. The method can also include connecting the source contact and/or the drain contact to the channel layer or disconnecting the source contact and/or the drain contact from the channel layer by respectively biasing the two or more select gates and the source contact and/or the drain contact.

In an implementation of the method, the method can further include applying a second voltage to the first gate when the channel layer is disconnected from the source contact and the drain contact to allow an electric field to develop that moves the one or more charge packets into the associated one or more memory cells by quantum mechanical tunneling.

All charge packets can be simultaneously (e.g., at once) tunneled into the associated memory cells. Without the first gate and the second voltage, these charge packets could be at floating potential inside the channel layer, and thus, no electric field would develop during the applied programming voltage pulse. The potential of the charge packets would be coupled to that of the word lines and would move up and down along with it.

In an implementation of the method, the step of injecting the charge into the channel layer, the step of forming the one or more charge packets, and the step of moving the charge packets into the memory cells can be repeated until a respective predetermined threshold voltage is obtained for each of the memory cells associated with the one or more second gates next to which the one or more charge packets are arranged.

Each memory cell may be programmed to a different or the identical predetermined threshold voltage. This could be done in one programming cycle (also referred to as programming step) or multiple programming cycles. One programming cycle can involve preparing charge packets and applying the programming voltage to move these charge packets.

In an implementation of the method, the method can further include applying a second voltage to the first gate when the programming voltage is applied to the one or more word lines.

The second voltage may be applied at the same time as the programming voltage to fix the channel potential.

In an implementation of the method, the method can further include erasing all the memory cells before injecting the charge into the channel layer. This step can bring all memory cells to the same threshold voltage. In particular, this step may be performed before the first programming cycle of one or more programming cycles.

In an implementation of the method, the one or more second gates adjacent to which the one or more charge packets are formed may not include any two second gates arranged adjacent to each other along the channel layer. This step can facilitate isolating the charge packets in the channel layer by establishing potential barriers in the channel layer by applying blocking voltage(s) to other second gate(s).

In an implementation of the method, the one or more second gates, next to which the one or more charge packets are formed, can be odd second gates or even second gates corresponding to their arrangement from a first second gate to a last second gate one after the other along the channel layer. This step can enable programming all memory cells efficiently in two programming steps.

In an implementation of the method, the channel layer, the first gate, and the second gates can form a string of the NAND flash memory, wherein the NAND flash memory can include more than one such string, and wherein the method can include: programming the memory cells of two or more strings at the same time by performing the step of injecting the charge into the channel layer, the step of forming the charge packets in the channel layer, and the step of applying the programming voltage to all the word lines, at the same time for each of the two or more strings.

In an implementation of the method, the memory cells of the NAND flash memory can be the floating gate type and/or the charge trap layer type.

In an implementation of the method, the channel layer can be a planar channel layer, the first gate can be a back-gate arranged on the first side being a back side of the channel layer, and the second gates can be front-gates arranged on the second side being a front side of the channel layer; or the channel layer can be a macaroni channel of the NAND flash memory being a 3D NAND flash memory, the first gate can be an inner-gate arranged at the first side being an inner side of the macaroni channel and surrounded by the macaroni channel, and the second gates can be outer-gates arranged at the second side being an outer side of the macaroni channel and surrounding the macaroni channel.

Thus, the method of the first aspect can be applicable to both planar NAND flash memories and 3D NAND flash memories. Regarding the planar NAND flash memories, the method can be applicable to vertical memory geometries.

In summary, the disclosed technology relates to a novel bit-selective NAND flash memory programming method that allows for small differential voltages between adjacent word lines. The programming method can be based on the injection of charge packets into the memory cells, wherein the charge packets reside in the semiconductor channel layer before being injected. The programming method may allow modulation of the magnitude and/or presence of the charge packets to render the programming bit-selective. This is akin to the well-known charge coupled device (CCD).

The programming scheme may first create the charge packets underneath all odd or even second gates, after which the memory cells associated with these second gates are all programmed at the same time by increasing the voltage of the respective word lines to the programming voltage. The entire procedure of preparation and injection of the charge packets can be repeated until the desired threshold voltage is obtained on each of the memory cells. The first gate can enable the proposed programming method at the first side of the semiconductor channel layer, wherein the first gate may allow the control of the channel layer potential while the charge packets are in place, and the channel layer is floating since it is cut off from the source contact and drain contact during the programming operation.

Additionally, the first gate can be utilized to improve control over the charge packet concentration by either accumulating extra charge or depleting the channel of charge. On the array level, the proposed programming scheme also allows for a simultaneous programming of all odd or even memory cells in an entire memory block. The charge packets are then prepared in the channel layers of all NAND strings in the block, after which they are injected into the memory cells at the same time by a single programming voltage pulse applied to all the word lines in the block. This block-level programming may be faster than conventional page-level programming, depending on several factors: string length, RC delay, and smallest possible pulse time.

BRIEF DESCRIPTION OF THE DRAWINGS

The above, as well as additional objects, features and advantages of the disclosed technology will be better understood through the following illustrative and non-limiting detailed description of preferred embodiment of the disclosed technology, with reference to the appended drawings. In the drawings like, reference numerals will be used for like elements unless stated otherwise.

DETAILED DESCRIPTION OF CERTAIN ILLUSTRATIVE EMBODIMENTS

Figure 1:
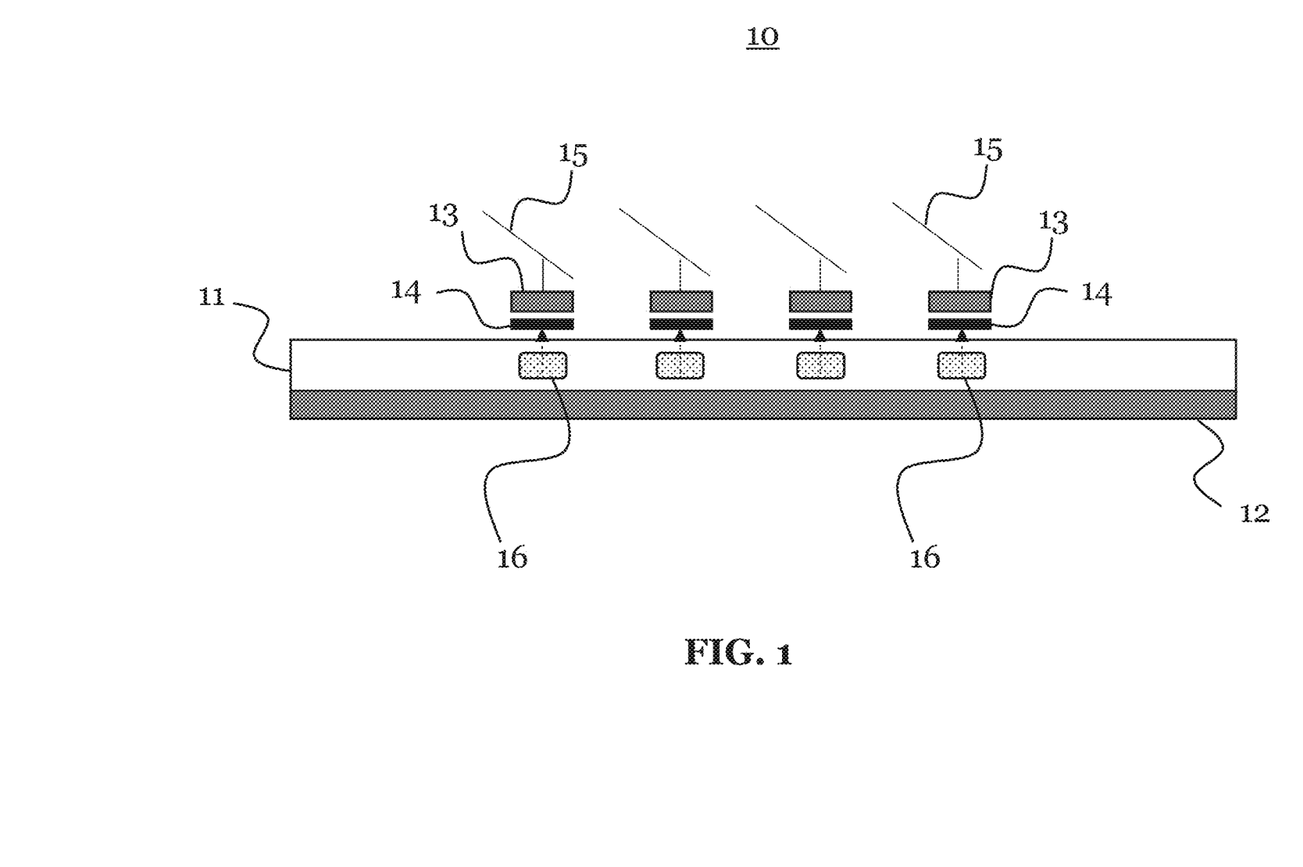
FIG. 1 shows a NAND flash memory according to one or more embodiments of the disclosed technology.

FIG. 1 shows a NAND flash memory 10 according to one or more embodiments of the disclosed technology. The NAND flash memory 10 may be a floating gate NAND flash memory and/or a charge trap layer NAND flash memory. For example, memory cells 14 of the NAND flash memory 10 may be of the floating gate type and/or of the charge trap layer type. The NAND flash memory 10 can be programmable, as further described in FIG. 2.

The NAND flash memory 20 can include a semiconductor channel layer 11, a first gate 12, a plurality of second gates 13, and a plurality of memory cells 14.

The first gate 12 can be arranged on a first side of the channel layer 11 and extends along the channel layer 11, for instance, completely or over a part of the channel length. If the channel layer 11 is a planar channel layer, as illustrated exemplarily in FIG. 1, the first gate 12 may be a back-gate, and the first side may be a back side or bottom side of the channel layer 11.

The second gates 13 can be arranged on a second side of the channel layer 11, different from the first side (e.g., on the other side of the channel than the first side). The second gates 13 can also be arranged one after the other along the channel layer 11, for instance, over the same length as the first gate 12. For example, the second gates 13 can be sequentially arranged along the length of the channel layer 11, such as over the same length as the first gate 12. For the example of the planar channel layer, the second gates 13 can be front-gates, and the second side can be a front side or upper side of the channel layer 11.

Each of the second gates 13 can be associated with one memory cell 14 of the NAND flash memory 10. The memory cell 14 can be a floating gate or charge trap layer or may include a floating gate or charge trap layer. The second gates 13 can be used to selectively move charge into and out of the memory cells 14, for example, to and from the floating gate or charge trap layer, by quantum mechanical tunneling. This tunneling may occur through a material barrier that is arranged between the channel layer 11 and each memory cell 14, e.g., a dielectric material. Each second gate 13 can be connected to one of a plurality of word lines 15, and the second gate 13 can be controlled by a signal or voltage provided on its associated word line 15. Dielectric material may also be arranged between the word lines 15 for isolation purposes.

Figure 2:
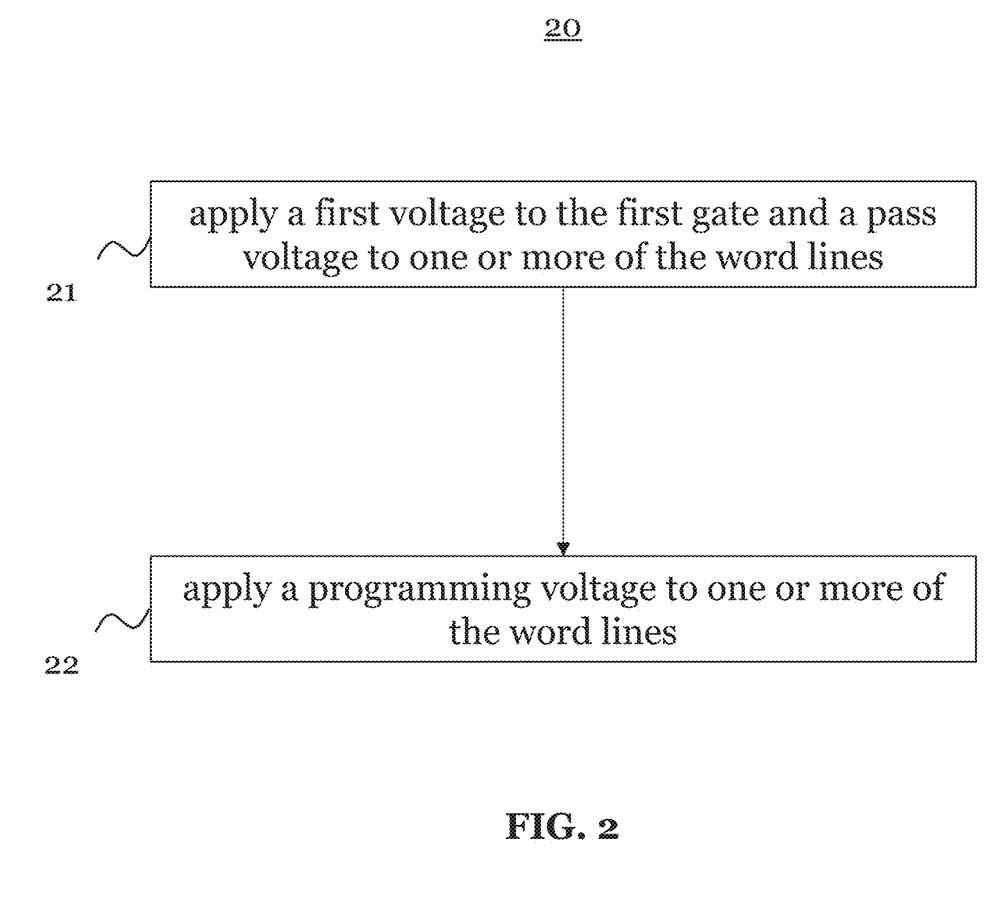
FIG. 2 shows a flow-diagram of a method according to one or more embodiments of the disclosed technology.

FIG. 2 illustrates an example of a flow-diagram of a method 20 for programming the NAND flash memory 20 of FIG. 1, according to one or more embodiments of the disclosed technology. The method 20 can enable programming the NAND flash memory 10 with a lowered of dielectric breakdown between different word lines 15.

The method 20 can include a step 21 of applying a first voltage to the first gate 12 and a pass voltage to one or more of the word lines 15. This step can allow the charge being injected into the channel layer 11, such as injection into the next to one or more of the second gates 13. The charge could be electrons or holes, and the type of charge can be determined based on the type of the NAND flash memory. This step 21 may also form one or more charge packets 16 from the charge in the channel layer 11, as explained below in more detail. Each of the one or more charge packets 16 can be arranged next to one of the one or more second gates 13.

The method 20 can further include a step 22 of applying a programming voltage to one or more of the word lines 15. Applying the voltage to the word lines 15 may move the one or more charge packets 16 from the channel layer 11 into the one or more memory cells 14, which are associated with the one or more second gates 13 positioned next to which the charge packets 16 have been arranged. The programming voltage may be applied at the same time to each of the one or more word lines 15. When the programming voltage is applied to the one or more word lines 15, a second voltage can be applied to the first gate 12 to facilitate moving the charge packets 16 into the memory cells 14.

Figure 3:
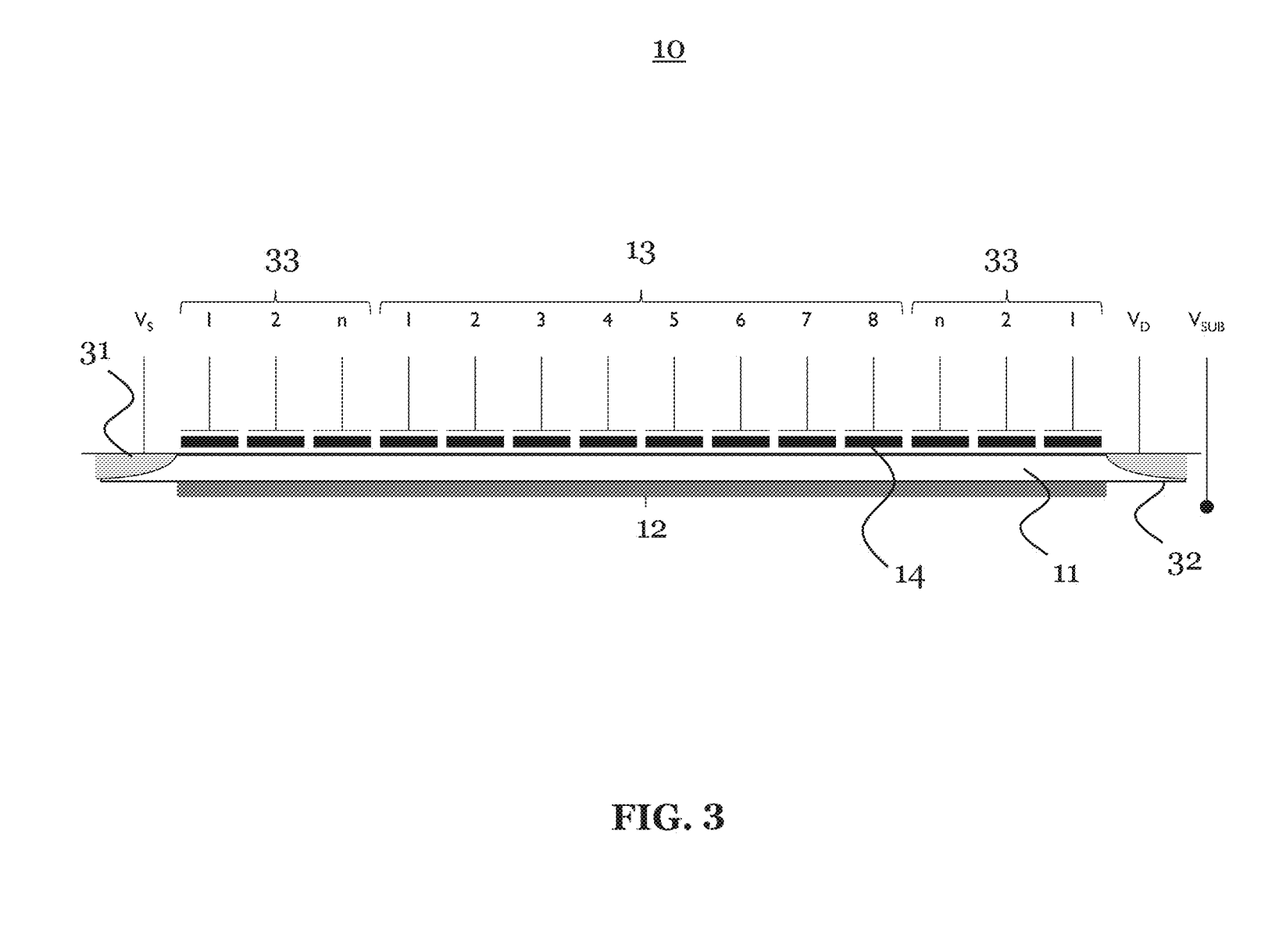
FIG. 3 shows an exemplary planar NAND flash memory according to one or more embodiments of the disclosed technology.

FIG. 3 shows an exemplary NAND flash memory 10 according to one or more embodiments of the disclosed technology. In addition to the NAND flash memory 10 of FIG. 1, the NAND flash memory 10 of FIG. 3 can include optional features. In some embodiments, these optional features can be added individually or on any combination to the NAND flash memory 10 of FIG. 1.

In some applications, the NAND flash memory 10 of FIG. 3 can further include a source contact 31 and a drain contact 33 in addition to the NAND flash memory 10 of FIG. 1. Each of the source contact 31 and the drain contact 33 can be selectively connectable to and disconnectable from the channel layer 11. For example, as shown in FIG. 3, the source contact 31 and the drain contact 33 can be respectively connectable to the channel layer 11 via two or more select transistors, wherein each select transistor is controllable by a select gate 33.

FIG. 3 further show one NAND string of the NAND flash memory 10, and the NAND string can have eight second gates 13 associated with eight memory cells 14, and each of source contact 31 and drain contact 32 can be connectable to the channel layer 11 by a plurality of select transistors and select gates 33. In some embodiments, for each source contact 31 and drain contact 32, a select transistor and a select gate 33 can be used. However, additional select transistors and select gates 33 may optionally be added for each source contact 31 and drain contact 32.

In some embodiments, the NAND flash memory 10 may include more than one NAND string. as shown in FIG. 3. In these embodiments, the method 20 may further include a step of programming the memory cells 14 of multiple strings at the same time.

In some embodiments, the method 20 may further include at least one of the source contact 31 and the drain contact 33 to the channel layer 11, when the charge is injected into the channel layer 11. The method 20 may also include a step of disconnecting the source contact 31 and the drain contact 33 from the channel layer 11, when the one or more charge packets 16 are moved from the channel layer 11 into the memory cells 14. This may include respectively biasing the two or more select gates 33, the source contact 31 and/or the drain contact 32. In some embodiments, a second voltage may be applied to the first gate 12 when the source contact 31 and the drain contact 32 are disconnected from the channel layer 11. This can develop an electric field, and the electric filed can cause the one or more charge packets 16 to move into the memory cells 14.

Regarding the exemplary NAND flash memory 10 of FIG. 3, it is understood by the person skilled in the art that the various parts of the example in a particular technology are connected in various ways to the various parts of the schematic presented herein. As described in the above, the memory cells 14 can be either of the floating gate or charge trap layer type. For example, storage layers, such as a charge trap layer or a floating gate, may form or be included by the memory cells 14. Charge trap layers of different memory cells 14 can either be separated or be one continuous layer.

Figure 4:
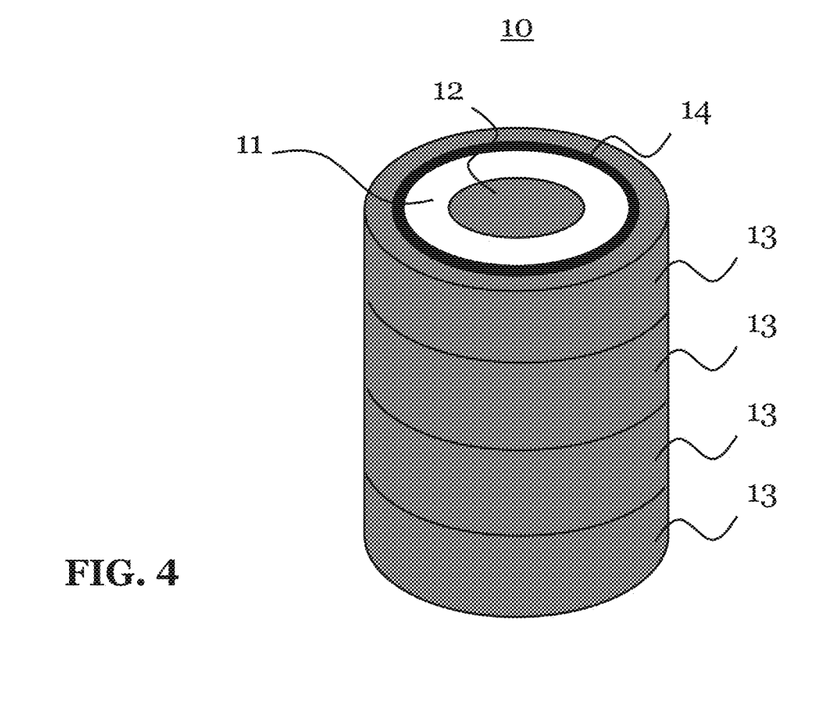
FIG. 4 shows an exemplary 3D NAND flash memory according to one or more embodiments of the disclosed technology.

FIG. 4 shows an example of 3D NAND flash memory according to one or more embodiments of the disclosed technology. In some embodiments, the NAND flash string can be implemented in a planar way, as shown in FIG. 3, or in 3D way as schematically illustrated in FIG. 4. The 3D NAND flash memory 10 of FIG. 4 can include a cylindrical memory hole with a gates all-around (GAA) structure surrounding the channel. For example, as shown in FIG. 4, the channel layer 11 may be a macaroni channel. The first gate 12 can be an inner gate and the first side can be the inner side of the macaroni channel. For example, the first gate 12 can be filled into the macaroni channel and/or the first gate 12 can be surrounded by the macaroni channel. The second gates 13 can be the outer gates, such as in this example, and the second side can be the outer side of the macaroni channel. For example, the plurality of second gates 13 can form the GAA structure, and each second gate 13 may surround the macaroni channel. The storage layer of the memory cells 14 can be arranged between the macaroni channel and the GAA structure formed by the second gates 13.

In various embodiments, the 3D NAND flash memory 10 and the first gate 12 may be provided with an accompanying gate oxide.

In the NAND flash memory 10 of the disclosed technology, multiple source and drain transistors can be optionally employed to limit the voltage difference between the word lines 15 and the select transistors. Alternatively, the select transistors can be separated from the first or last word line 15 by a larger spacing.

In the following, an exemplary programming scheme (method 20) for programming the NAND flash memory 10 according to this disclosed technology is described in detail:

Prior to the programming operation of the NAND flash memory 10, an erase operation may be performed to bring all memory cells 14 to the same and low threshold voltage state. For example, the method 20 may further includes erasing all the memory cells 14 before injecting the charge into the channel layer 11.

For instance, a first programming step (or cycle) could involve programming all odd numbered memory cells 14 to a target threshold voltage by means of the steps described below. A second programming step (or cycle) could then program the even numbered cells in a similar fashion by repeating the steps described below with necessary adjustments to the voltages applied to the various electrical contacts of the NAND flash string. For instance, in the first programming step, the one or more second gates 13, next to which the one or more charge packets 16 are formed, may be odd second gates 13. In the second programming step, the one or more second gates 13, next to which the one or more charge packets 16 are formed, may be even second gates 13. As shown in FIG. 3, "odd" and "even" can correspond to the arrangement of the second gates 13 from a first second gate 13 (#1) to a last second gate 13 (#8), arranged one after the other along the channel layer 11. Notably, the method 20 may not require that the one or more second gates 13 in each programming step are only odd or only even gates. Any second gates 13 could potentially be selected. In another example, in any programming step, the one or more second gates 13, where next to which the one or more charge packets 16 are formed, may be selected such that no two selected second gates 13 are arranged adjacent to each other along the channel layer 11.

For a programming step to be executed, the source contact 31 and the drain contact 32 may initially be grounded. In addition, a high bias may be applied to the select gates 33 for the source contact 31 and the drain contact 32 to switch on the select transistors. For example, the source contact 31 and the drain contact 32 can be connected to the channel layer 11. Simultaneously, a positive bias (referred to as the "pass voltage") can be applied to one or more or all the word lines 15 in order to bring the channel layer region underneath the one or more or all memory cells 14 into inversion. This may allows charge to inject into the channel layer 11. The applied pass voltage to the word lines 15 should be at least higher than the highest threshold voltage targeted for multi-bit programming (e.g., about 4V). A higher pass voltage may increase the charge in the channel layer 11 and the charge packets 16 that are formed from the charge, which leads to faster programming. However, the pass voltage may be limited by program disturb (e.g., above 15V). The pass voltage may thus be in a range of about 4-15V.

In some embodiments, the bias on the select gates 33 for the source contact 32 may be lowered to switch off the source select transistors.

For programming, for example, programming the odd numbered memory cells 14 in the first programming step, the charge packets 16 may be placed in the channel layer 11 underneath each of the odd numbered memory cells 16. The amount of charge in the charge packets 16 underneath each of the memory cell 14 can be depend on the desired target threshold voltage for each of these memory cells 14. A respective target threshold voltage may be desired for each of the memory cells 14 associated with the second gates 13 next to which the one or more charge packets 16 are arranged. The respective target threshold voltages could differ for two or more of these memory cells 14.

The placement of charge packets 16 may be accomplished iteratively. For example, the charge might first be placed underneath the memory cell 14 associated with the first second gate in FIG. 3 (#1). Then, it could be placed the underneath the memory cell 14 associated with the next odd second gate 13 along the channel layer (#3), and so on, until all odd numbered memory cells 14 have the desired amount of charge in the charge packet 16. The placement of the charge packet 16 for the first second gate (#1) is described below. The placement of the charge packets under the other memory cells 14 can be done in a similar way.

If the threshold voltage of the memory cell 14 associated with the first second gate 13 (#1) needs to be increased, the bias on the drain contact 32 can be kept at a low level, thus, keeping the inversion charge underneath said memory cell 14 all other memory cells 14. Subsequently, the bias on the next second gate 13 along the channel layer 11 (#2) can be lowered (referred to as the "blocking voltage") to induce a potential barrier in the channel layer 11 that isolates the charge packet 16 underneath the memory cell 14 associated with the first second gate (#1). The blocking voltage on the second gate 13 (#2) should be low enough to ensure the isolation independent of the program state of the memory cell 14 associated with the second gate 13 (#2). The worst case condition would be when the memory cell 14 associated with this second gate 13 (#2) is in the erased state, wherein the threshold voltage can be as low as −3V. The blocking voltage on the second gate 13 (#2) may again be limited by disturbing the state of its associated memory cell 14. The differential voltage between the word line 15 connected to the first second gate (#1) and the word line 15 connected to the next second gate 13 (#2) can be limited to the difference between the pass voltage and the blocking voltage.

In the case where the threshold voltage of the memory cell 14 associated with the first second gate 13 (#1) does not need to be raised, the bias on the drain contact 32 is raised. This will cause the inversion charge underneath the memory cells 14 to flow back to the drain contact 32, leaving no charge underneath the memory cell 14 associated with the first second gate 13 (#1), even though the bias on the first second gate 13 (#1) is still high. The select transistors prevent any charge from flowing in on the source side of the memory cell 14 associated with the first second gate 13 (#1). Next, the application of the blocking voltage on second gate 13 (#2) isolates the channel layer region underneath the first memory cell 14 from the channel layer regions in the remainder of the NAND string.

Optionally, the bias on drain contact 32 can be modulated in between the low and high bias states described above in order to regulate the amount of charge that is placed underneath the memory cell 14 instead of merely controlling the presence or absence of charge.

The above-described sequence is now repeated to place charge underneath the memory cell 14 associated with the next odd second gate 13 (#3). Biases on the second gates (#1) and (#2) can either remain constant during the charge placement for the memory cell 14 associated with the second gate 13 (#3), or they can be connected with the other odd or even second gates 13, respectively, to simplify the programming scheme.

The above steps may be repeated to place charge underneath all memory cells 14 associated with odd second gates 13 (#1, #3, #5, and #7 in FIG. 3). No charge is present underneath the memory cells 14 associated with even second gates 13 (#2, #4, #6, and #8 in FIG. 3), since these second gates 13 (and connected word lines 15) are used to separate the charge packets 16 of the odd memory cells 14.

Then, a low bias may be applied to the select gates 33 to turn off the select transistors for the source contact 31 and the drain contact 32. This can isolate the channel layer 11 from both the source and drain contacts 31, 32. Due to the long lifetimes of minority carriers, for example, in high-quality silicon substrates and silicon-to-silicon dioxide interfaces, at least in the order of milliseconds, sufficient time is available to place these charges and keep the amount of charge unchanged until the time of moving the charge packets 16 into the storage layers of the memory cells 13.

Then, the bias on one or more or all word lines 15 can be raised by or to the same amount (referred to as the "programming voltage") to increase the vertical electric field over tunnel oxide arranged between channel layer 11 and memory cells 14, and thereby inject the charge packets 16 residing in the channel layer 11 into the memory cells 14 through tunneling. The addition of the program voltage to the word lines 15 keeps the differential voltage between adjacent word lines 15 unchanged and limited to the difference between the blocking voltage and the pass voltage. Because bias differentials between the word lines 15 are maintained during the application of the programming pulse, the potential wells induced at the position of the memory cells 14 associated with the odd second gates 13 will persist during programming so that the charge packets 16 stored underneath each of these memory cells 14 is injected into the storage layer of the respective memory cell 14 only. At the same time as the program pulse to the word lines 15, an opposite voltage may be applied to the first gate 12 (namely, the second voltage), to fix the channel potential. This may be beneficial because the channel layer 11 is floating as it is disconnected from the source contact 31 and the drain contact 32 by the select transistors controlled by the select gates 33. Without the first gate bias, the channel layer potential may move with the applied programming voltage, and thus, the electric field over the tunnel oxide may only barely increase. Optionally, the bias on multiple select gates 33—e.g., the select gates 33 (#2 and #n) for source contact 31 and drain contact 32 can be regulated to minimize the differential voltage between select lines, which are connected to these select gates 33, and the word lines 15 adjacent to the select lines, as well as between adjacent select lines.

The above described programming sequence can optionally be repeated one or more times. After each repetition, a threshold voltage verification step can be executed, to check the threshold voltages on each memory cell 14. Depending on the difference between the actual and desired target threshold voltage of each memory cell 14, more charge could be injected into the memory cells 14 by repeating the procedure.

An alternative to the above described procedure could be used. For example, first, all memory cells 14 associated with odd second gates 13 can be programmed, followed by all memory cells 14 associated with even second gates 13. In some examples, the memory cells 14 associated with the first second gate 13 (#1) can be programmed, then the memory cell 14 associated with the next second gate (#2) can be programmed, and so on. In these programming steps, one or more of the second gates 13 may be selected. In some embodiments, adjacent second gates 13 may be avoided but do not have to be, in which case one or more selected second gates 13 do not include any two second gates 13 arranged adjacent to another along the channel layer 11.

As an alternative to the above described procedure, optional select transistors—for source contact 31 and/or drain contact 32 can be used to transfer a controlled amount of charge into the NAND string channel layer 11, similar to what is done to transfer charge through a charge-coupled device (CCD) register.

The above-described procedure can be used to prepare the charge packets 16 for the one or more memory cells 14 associated with the one or more second gates 13 (e.g., all odd or even memory cells 14 in a given memory block), and then program them all with a single programming (voltage) pulse applied to all word lines 15 in the block. Bit selectivity on the same page may be achieved through the drain contact bias, which may determine the charge packet 16 concentration for each of the memory cells 14.

Figure 5A:
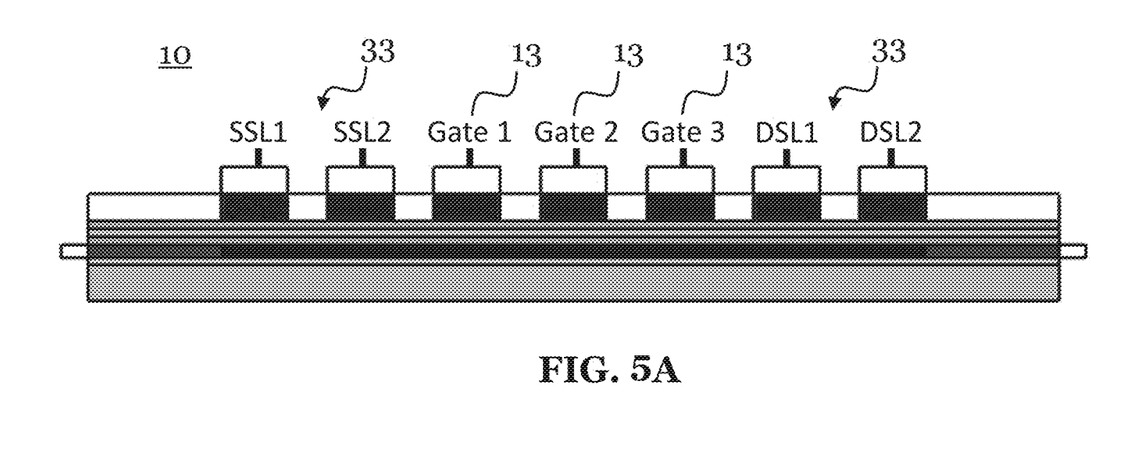
FIG. 5A shows an example of NAND flash memory for simulation.
Figure 5B:
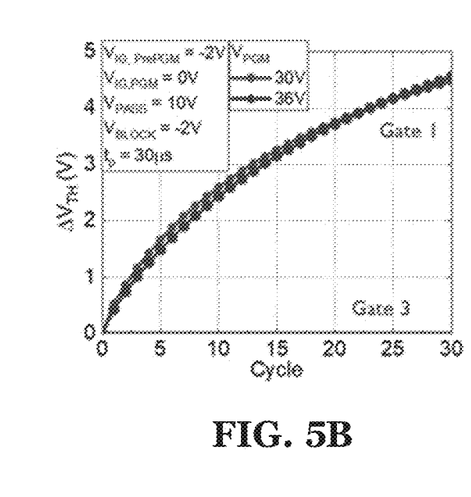
FIG. 5B shows simulation results obtained from the NAND flash memory illustrated in FIG. 5A.
Figure 5C:
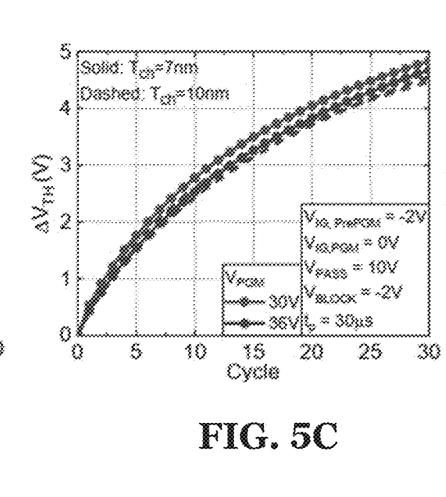
FIG. 5C shows simulation results obtained from the NAND flash memory illustrated in FIG. 5A.
Figure 5D:
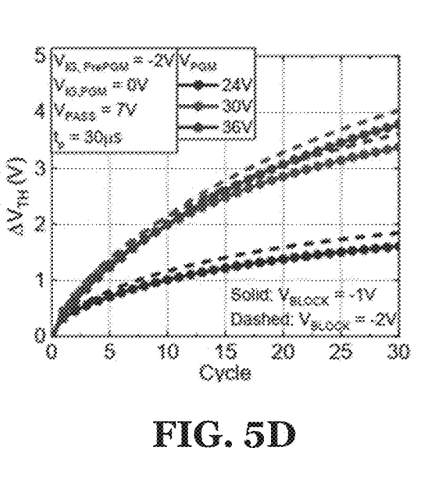
FIG. 5D shows simulation results obtained from the NAND flash memory illustrated in FIG. 5A.

FIG. 5A illustrates an example of a NAND flash memory according to this disclosed technology. FIGS. 5B-5D illustrate simulation results for the NAND flash memory 10, as shown in FIG. 5A, according to this disclosed technology. The simulation results can illustrates the concept of this disclosed technology.

The simulations can simulate the seven second gate GAA around structure shown in FIG. 5A, for example. The seven gates can include three second gates 13 (#1, #2, #3), and four select gates 33, two for each of the source contact 31 (SSL1, SSL2) and the drain contact 32 (DSL1, DSL2). The simulations can be 2.5 D, assuming a symmetry rotation, which corresponds to a 3D structure with a cylindrical memory hole. The storage layer of the memory cells 14 is a continuous charge trap layer (e.g., formed of a nitride such as SiN).

In these simulations, the aim was to program the odd second gates 13, such as the second gate 13 (#1) to the high threshold voltage (e.g., corresponding to a bit 0) and the other second gate 13 (#13) to a low threshold voltage (e.g., corresponding to a bit 1).

FIG. 5B shows the threshold voltage shift (ΔVTH) of the two second gates 13 (#1 and #3) after a given number of programming cycles, showing bit-selective programming. Each cycle can correspond to a programming sequence as described above, including the preparation of the charge packets 16 in the channel layer, followed by the injection of the charge packets 16 into the memory cells 14.

The ΔVTH of the second gate 13 (#1) can be increased with each cycle, reaching more than 4V of ΔVTH after 25 cycles. Each cycle can be shorter than a typical pulse in a flash programming curve, since, for each cycle, a finite packet 16 of charge needs to be injected (pulse time is indicated with tp).

The ΔVTH of the other second gate 13 (#3) can be about 10 mV after 30 cycles, which constitutes a low disturb. The low disturb can be achieved with the application of a negative bias to the first gate 12 (VIG, PrePGM), which depletes the charge that can be present underneath the second gate 13 (#3). During the entire programming operation, the maximal voltage difference between word lines 15 is 12V.

FIGS. 5C and 5D show optimizations to the channel thickness and operating biases, respectively. A thinner channel layer 11 is shown to improve the programming behavior. The optimization of the gate control can allow the accumulation of more charge at a given pass voltage. FIG. 5D shows that the blocking voltage and the pass voltage can be reduced while maintaining bit-selective programming, although more cycles are required to obtain a given ΔVTH. In this way, the maximal voltage difference between the word lines 15 can be further reduced to 8V.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A method for operating a NAND flash memory, comprising:
    providing the NAND flash memory, the NAND flash memory comprising:
        a semiconductor channel layer,
        a first gate arranged on a first side of the channel layer and extending along the channel layer, and
        a plurality of second gates arranged on a second side of the channel layer and sequentially along the channel layer, wherein each second gate is associated with a memory cell of the NAND flash memory and connected to one of a plurality of word lines;
    applying a first voltage to the first gate and a pass voltage to one or more word lines to inject charge into the channel layer positioned next to one or more second gates and form one or more charge packets from the charge in the channel layer, wherein each charge packet is formed adjacent to one of the one or more second gates; and
    applying a programming voltage to the one or more word lines to move the one or more charge packets from the channel layer into one or more charge storage layers associated with the one or more second gates adjacent to which the one or more charge packets are formed.

2. The method according to claim 1, wherein the programming voltage on the one or more word lines is applied simultaneously, and wherein a bias voltage applied to the one or more word lines is simultaneously increased to the programming voltage.

3. The method according to claim 1, wherein forming a charge packet in the channel layer next to a particular second gate comprises applying a blocking voltage to the one or more second gates other than the particular second gate to isolate the charge next to the particular second gate as the charge packet.

4. The method according to claim 1, wherein the NAND flash memory further comprises a source contact and a drain contact, wherein the source contact and the drain contact are configured to connect to the channel layer and disconnect from the channel layer, and wherein the method of connecting and disconnecting the source contact and the drain contact comprises:
- connecting one or both of the source contact and the drain contact to the channel layer when the charge is injected into the channel layer; and
- disconnecting the source contact and the drain contact from the channel layer when the one or more charge packets are moved from the channel layer into the one or more charge storage layers.

5. The method according to claim 4, wherein the source contact and the drain contact are respectively connectable to the channel layer via two or more select transistors by connecting one or both of the source contact and the drain contact to the channel layer by respectively applying a biasing voltage to each gate of the two or more select transistors and one or both of the source contact and the drain contact, wherein the two or more select transistors are controllable by two or more select gates.

6. The method according to claim 4, wherein the source contact and the drain contact are respectively disconnectable from the channel layer via two or more select transistors by disconnecting one or both of the source contact and the drain contact from the channel layer by respectively applying biasing voltage to each gate of the two or more select transistors and one or both of the source contact and the drain contact, wherein the two or more select transistors are controllable by two or more select gates.

7. The method according to claim 4, further comprising:
- applying a second voltage to the first gate when the channel layer is disconnected from the source contact and the drain contact to generate an electric field that moves the one or more charge packets into the associated one or more charge storage layers by quantum mechanical tunneling.

8. The method according to claim 1, wherein injecting the charge into the channel layer, forming the one or more charge packets, and moving the one or more charge packets into the one or more charge storage layers are repeated until a respective predetermined threshold voltage is obtained for each of the memory cells associated with the one or more second gates next to which the one or more charge packets are arranged.

9. The method according to claim 1, further comprising:
- applying a second voltage to the first gate when the programming voltage is applied to the one or more word lines.

10. The method according to claim 1, further comprising:
- erasing each of the memory cells before injecting the charge into the channel layer.

11. The method according to claim 1, wherein the one or more second gates, next to which the one or more charge packets are formed, do not include any two second gates arranged adjacent to another along the channel layer.

12. The method according to claim 1, wherein the one or more second gates are odd numbered second gates or even numbered second gates, corresponding to their arrangement from a first second gate to a last second gate sequentially along the channel layer.

13. The method according to claim 1, wherein the channel layer, the first gate, and the second gates are configured to form a string of the NAND flash memory, wherein the NAND flash memory comprises more than one strings, and wherein the method further comprising:
- programming the memory cells of two or more strings at same time by:
  - injecting the charge into the channel layer;
  - forming the charge packets in the channel layer; and
  - applying the programming voltage to all the word lines, at the same time for each string.

14. The method according to claim 1, wherein the memory cells of the NAND flash memory are a floating gate type, and the charge storage layers include floating gates.

15. The method according to claim 1, wherein the memory cells of the NAND flash memory are a charge trap layer type, and the charge storage layers include charge trap layers.

16. The method according to claim 1, wherein:
- the channel layer is a planar channel layer;
- the first gate is a back-gate arranged on the first side being a back side of the channel layer; and
- the second gates are front-gates arranged on the second side being a front side of the channel layer.

17. The method according to claim 1, wherein:
- the channel layer is a macaroni channel of the NAND flash memory being a three-dimensional NAND flash memory, the first gate is an inner-gate arranged at the first side being an inner side of the macaroni channel and surrounded by the macaroni channel, and the second gates are outer-gates arranged at the second side being an outer side of the macaroni channel and surrounding the macaroni channel.

\* \* \* \* \*